United States Patent [19]
Hsu

[11] Patent Number: 5,468,981
[45] Date of Patent: Nov. 21, 1995

[54] SELF-ALIGNED BURIED CHANNEL/JUNCTION STACKED GATE FLASH MEMORY CELL

[75] Inventor: James Hsu, Saratoga, Calif.

[73] Assignee: Advanced Micro Devices, Inc., Sunnyvale, Calif.

[21] Appl. No.: 299,868

[22] Filed: Sep. 1, 1994

[51] Int. Cl.$^6$ .................................................. H01L 29/78
[52] U.S. Cl. ............................................ 257/316; 257/322
[58] Field of Search ..................................... 257/322, 316, 257/315, 335; 437/35; 365/185

[56] References Cited

U.S. PATENT DOCUMENTS

| | | | |
|---|---|---|---|
| 4,161,039 | 7/1979 | Rössler | 257/316 |
| 5,147,811 | 9/1992 | Sakagami | 437/35 |
| 5,278,787 | 1/1994 | Iwasa | 257/335 |
| 5,349,220 | 9/1994 | Hong | 257/316 |
| 5,378,909 | 1/1995 | Chang et al. | 257/316 |

Primary Examiner—Robert P. Limanek
Attorney, Agent, or Firm—Davis Chin

[57] ABSTRACT

An improved one-transistor flash EEPROM cell structure and a method for making the same is provided so that the effective channel length dimension is independent of the critical dimensions of the stacked gate structure. The cell structure (110) includes an n$^-$ buried channel/junction region (116) which is implanted in a substrate (112) before formation of a tunnel oxide (126) and a stacked gate structure (134). After the formation of the stacked gate structure, a p-type source region (122) is implanted with a large tilt angle in the substrate. Thereafter, n$^+$ drain and n$^+$ source regions (118, 124) are implanted in the substrate so as to be self-aligned to the stacked gate structure. The cell structure of the present invention facilitates scalability to small size and is useful in high density and low voltage power supply applications.

5 Claims, 1 Drawing Sheet

5,468,981

SELF-ALIGNED BURIED CHANNEL/JUNCTION STACKED GATE FLASH MEMORY CELL

BACKGROUND OF THE INVENTION

1. Field of the Invention

This invention relates generally to floating gate memory devices such as electrically erasable and programmable read-only memory devices (EEPROMs) and a method for making the same. More specifically, the present invention is directed to the structure and manufacture of an improved single-transistor EEPROM cell suitable for use in high density and low voltage power supply applications.

2. Description of the Prior Art

As is generally known in the art, there exists a class of non-volatile memory devices referred to as "flash EEPROMs" which has recently emerged as an important memory device by combining the advantages of EPROM density with EEPROM electrical erasability. Such flash EEPROMs provide electrical erasing and a small cell size. FIG. 1 illustrates a prior art cross-sectional view of an asymmetrical flash EEPROM cell 10. The EEPROM cell is formed of a substrate 12, typically of a p-type conductivity, having embedded therein an $n^+$ drain region 14 and an n-type double-diffused source region 16. The double-diffused source region 16 is formed of a deeply diffused but lightly doped n-junction 18 and a more heavily doped but shallower $n^+$ junction 20 embedded within the deep n-junction 18. The deeply diffused n-junction 18 is typically formed by using a phosphorous implant, and the shallower $n^+$ junction 20 is typically formed by using an arsenic implant after the phosphorous implant.

A relatively thin gate dielectric layer 22 (i.e., silicon dioxide having a uniform thickness of about 100 Å) is interposed between the top surface of the substrate 12 and a conductive polysilicon floating gate 24. A polysilicon control gate 26 is insulatively supported above the floating gate 24 by an interpoly dielectric layer 28. The floating gate 24, interpoly dielectric layer 28, and control gate 26 define a stacked gate structure. A channel region 30 in the substrate 12 separates the drain region 14 and the source region 16. The entire structure is overlaid by an oxide insulating layer 32 so as to isolate the transistor cell structure from periphery devices. Further, there are provided means for applying a source voltage $V_S$ through the oxide layer 32 to the source region 16, a gate voltage $V_G$ to the control gate 26, and a drain voltage $V_D$ through the oxide layer 32 to the drain region 14.

According to conventional operation, the flash EEPROM cell of FIG. 1 is "programmed" by applying a relatively high voltage $V_G$ (approximately +12 volts) to the control gate 26 and a moderately high voltage $V_D$ (approximately +9 volts) to the drain 14 in order to produce "hot" (high energy) electrons in the channel 30 near the drain 14. The hot electrons are generated and accelerated across the gate dielectric 22 and onto the floating gate 24 and become trapped in the floating gate since the floating gate is surrounded by insulators. As a result, the floating gate threshold may be increased by 3 to 5 volts. This change in the threshold voltage, or channel conductance, of the cell created by the trapped hot electrons is what causes the cell to be programmed.

In order to erase the flash EEPROM cell of FIG. 1, the relatively high voltage $V_S$ (approximately +12 volts) is applied to the source 16 while the control gate 26 is grounded ($V_G=0$). The drain 14 is usually allowed to float. Under these conditions, a strong electric field is developed across the tunnel oxide between the floating gate and the source region. The electrons trapped in the floating gate flow toward and cluster at the portion of the floating gate overlying the $n^+$-type source region 16 and are extracted from the floating gate 24 to the source 16 by way of Fowler-Nordheim (F-N) tunneling.

High program and erase voltages for such conventional EEPROM devices are of major concern. Such a requirement has led to a need for a separate high voltage power supply when operating these devices by the provision of a special charge pumping circuit for boosting the power supply voltages to the requisite program and erase levels. The flash EEPROM cell of FIG. 1 suffers from another disadvantage in that the effective channel length $L_{eff}$ in the p-type substrate will be sensitive to the critical dimensions of the stacked gate structure which is subject to variations and is difficult to precisely control. As a result, the conventional EEPROM cell is incapable of providing scalability to small size (i.e., from 1 micron technology to a sub-half micron design).

It would therefore be desirable to provide an improved single-transistor EEPROM cell structure and a method for making the same so that the effective channel length dimension is independent of the critical dimensions of the stacked gate structure. Further, it would be expedient that the cell structure be able to facilitate scalability to small size and be suitable for use in high density and low voltage power supply applications.

SUMMARY OF THE INVENTION

Accordingly, it is a general object of the present invention to provide an improved single-transistor EEPROM cell structure which overcomes the disadvantages of the prior art flash EEPROM memory devices.

It is an object of the present invention to provide an improved single-transistor EEPROM cell structure and a method for making the same so that the effective channel length dimension is independent of the critical dimensions of the stacked gate structure.

It is another object of the present invention to provide an improved single-transistor EEPROM cell structure which facilitates scalability to small size and is suitable for use in high density and low voltage power supply applications.

It is still another object of the present invention to provide an improved single-transistor EEPROM cell structure which has a relaxed drain junction breakdown so as to minimize band-to-band tunneling induced leakage current.

It is yet still another object of the present invention to provide an improved single-transistor EEPROM cell structure which permits page mode parallel write with more cells without current limit in order to speed up the write speed per cell.

In accordance with these aims and objectives, the present invention is concerned with the provision of a single-transistor EEPROM cell structure which includes a silicon semiconductor substrate. An $n^-$ buried channel/junction region is disposed in the substrate. An $n^+$-type drain region is disposed in the substrate and on one side of the $n^-$ buried channel/junction region defining a drain side. A source structure is disposed in the substrate and on the other side of the $n^-$ buried channel/junction region defining a source side. The source structure includes a first p-type source region and a second $n^+$-type source region disposed in the first p-type source region. A tunnel oxide is disposed on the substrate. A stacked gate structure is disposed on the tunnel oxide.

In another aspect of the present invention, there is provided a method of forming a self-aligned flash memory cell device on a silicon semiconductor substrate.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

The improved memory cell structure of the present invention is described in the context of a flash EEPROM cell. Such flash EEPROM cell may be formed by a single transistor. It should be clearly understood to those skilled in the art that the improved flash EEPROM cell structure of the present invention has many uses in other applications. Specifically, the EEPROM cell of the present invention may be utilized in electrically erasable programmable logic arrays and other programmable logic devices.

Figure 1:
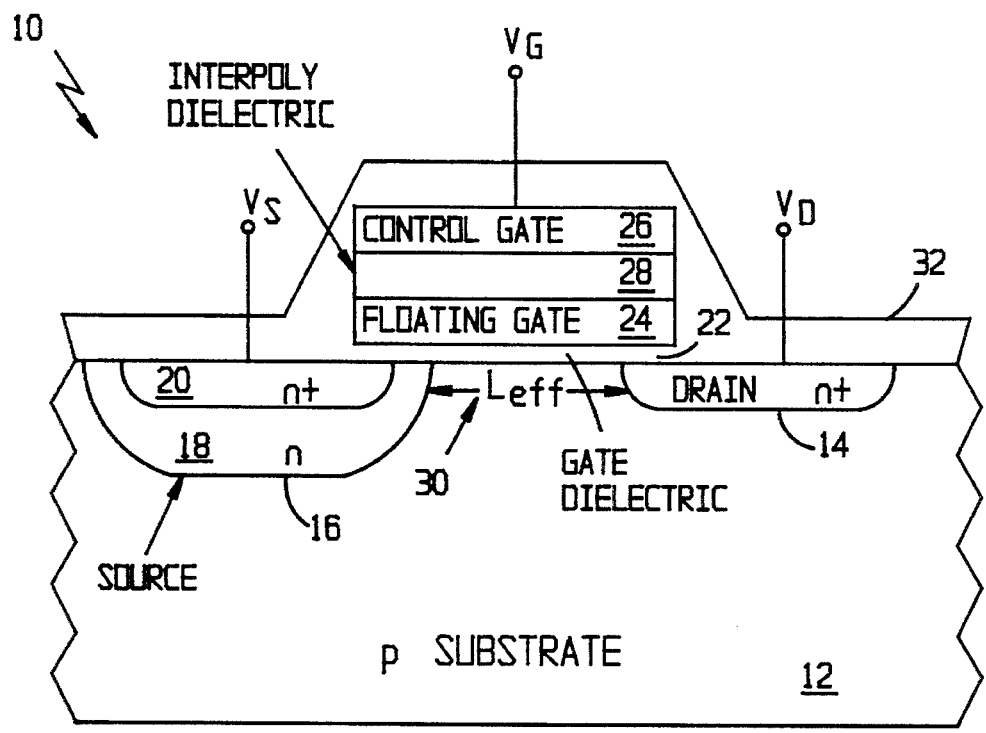
FIG. 1 illustrates a cross-sectional view of a conventional asymmetric flash EEPROM cell and has been labeled "Prior Art.
Figure 2:
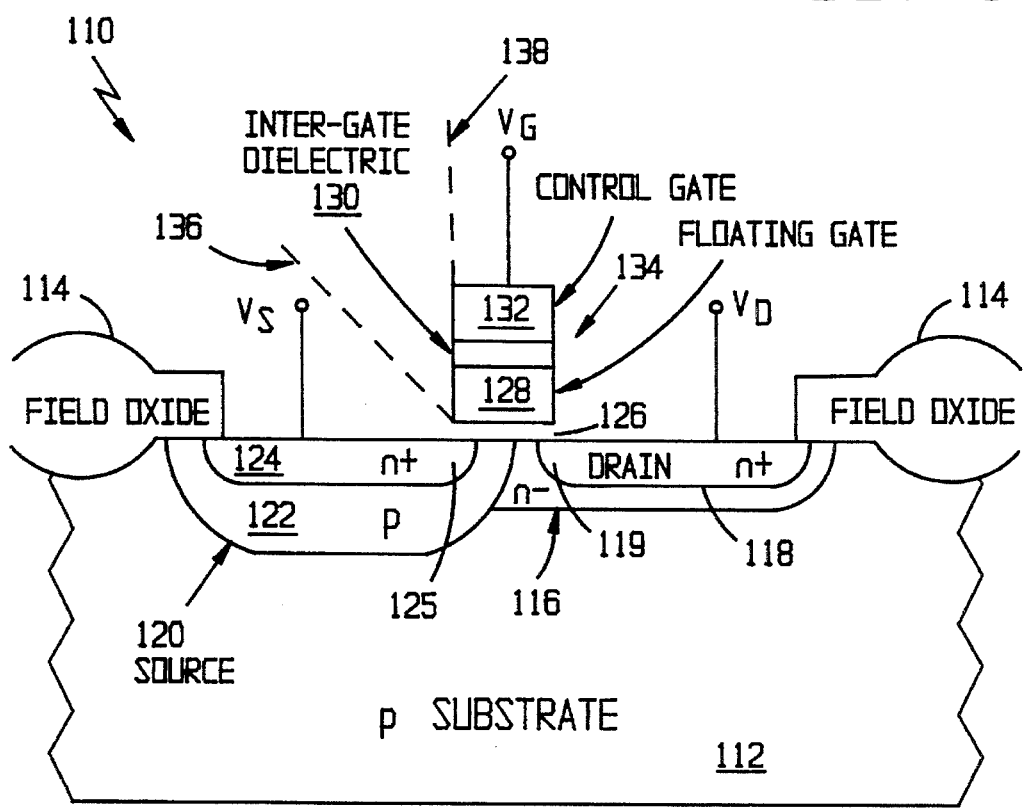
" and FIG. 2 illustrates a cross-sectional view of a single-transistor EEPROM cell, constructed in accordance with the principles of the present invention.

Referring now to FIG. 2 of the drawings, there is shown a stacked gate, one-transistor memory cell structure 110 which is constructed in accordance with the principles of the present invention. The memory cell structure is formed in a portion of a substrate 112 which is isolated by field oxide regions 114. The substrate 112 is usually formed of a p-type semiconductor material. An n⁻ buried channel/junction region or layer 116 is implanted in the substrate 112. The substrate is also provided with an n⁺-type drain region 118 and a source structure 120 embedded therein. The source structure 120 includes a first p-type implant and diffusion region 122 and a second n⁺-type region 124 formed in the region 122.

A tunnel oxide 126 of a uniform thickness is provided on the top surface of the substrate 112. The tunneling oxide 126 has a thickness of approximately 100 Å, but may be made to be smaller (i.e., in the range between 50–90 Å) for sub-micron technologies. A polysilicon floating gate 128 is provided on the tunneling oxide 126, and an inter-gate dielectric 130 separates the floating gate 128 from a control gate 132. The floating gate 128, inter-gate dielectric 130, and control gate 132 define a stacked gate structure 134. As can be seen, the stacked gate structure 134 is formed over the n⁻ buried channel/junction region 116 and extends between the drain region 118 and the source region 120. It is to be noted that the tunneling oxide overlies the portion 119 of the n⁺ drain region 118, the p-type source region 122, and a portion 125 of the n⁺-type source region 124. Further, there are provided means for applying a source voltage $V_S$ to the source region 124, a gate voltage $V_S$ to the control gate 132, and a drain voltage $V_D$ to the drain region 118.

The n⁻ buried channel/junction region 116 serves to greatly increase the drain junction breakdown voltage due to less electrical field resulted from the graded n⁺/n⁻ junction. The reduced generation of hot holes is useful in minimizing the band-to-band tunneling induced leakage current and also hot hole trapping in the tunnel oxide, thereby rendering better reliability. Since a positive bias is applied to the drain and the gate is grounded (or a positive bias is applied to the drain and a negative bias is applied to the gate) with the source left floating during programming, F-N tunneling occurs from the floating gate to the drain side so as to discharge the floating gate. This also permits page mode parallel write (programming) of many more cells without current limit to speed up the write speed per cell. Further, the relaxed electric field of the drain side enhances immunity to drain disturb.

On the other hand, during erase a positive bias is applied to the gate and the drain is grounded (or a positive bias is applied to the gate and a negative bias is applied to the drain) with the source also left floating. As a result, F-N tunneling occurs from the channel region and drain side to the floating gate so as to charge the floating gate. It should be appreciated from the foregoing description that the F-N tunneling technique is used in both the write (programming) and erase operations in the cell structure of the present invention. Thus, the structure 110 is suitable for use in applications requiring low power supply voltages and low power charge pumping circuits.

The p-type implant and diffusion region 122, provided on the source side, renders the actual channel length of the cell to be set and completely independent of the critical dimensions of the stacked gate structure 134.

The fabrication of the flash memory cell in accordance with the present invention includes the following steps: First, field oxide regions 114 are formed on the substrate 112 so as to separate the areas where multiple flash EEPROM cells will be formed on the single substrate. The n⁻ buried channel/junction region 116 is implanted in the substrate 112 after LOCOS (local oxidation of silicon). The dopant used for the n⁻ buried channel region 116 is phosphorous with a density in the range of $1 \times 10^{13}$ to $3 \times 10^{14}$ ions/cm². The depth of this n⁻ buried channel/junction phosphorous diffusion is preferably between 1000–2000 Å, depending upon actual device size. The tunnel oxide 126 is then grown on the surface of the substrate 112. Next, the stacked gate structure 134, including the floating gate 128, intergate dielectric 130 (usually silicon oxide or a combination of silicon oxide and nitride) and the control gate 132, is formed on the tunnel oxide 126. In accordance with conventional manufacturing techniques, the various elements of the stacked gate structure 134 are formed as continuous layers and are then etched to achieve the final structure.

After the stacked gate structure 134 is formed, a first side of the cell, which is to become the drain, is masked, and the p-type region 122 is formed by implanting on a second or source side of the cell with a large tilt angle. The term "large tilt angle" refers to the angle between a line 136 with respect to the line 138 disposed perpendicularly to the stacked gate structure 134. Preferably, the large tilt angle is in the range of 15° to 45°. The p-type region 122 is implanted in the substrate utilizing a p-type dopant (i.e., boron ions) with a density in the range of $5 \times 10^{13}$ to $8 \times 10^{14}$ ions/cm² and an energy ranging from 20–70 Kev and driving the implanted ions with a thermal cycle.

Finally, the n⁺ drain region 118 and the n⁺ source region 124 are implanted in the substrate utilizing an arsenic dopant with an energy ranging from 30–70 Kev and thermally driven. Since the stacked gate structure 134 is formed prior to implanting the source region 124 and the drain region 118, the source and drain are self-aligned with the stacked gate structure 134.

From the foregoing detailed description, it can thus be seen that the present invention provides an improved one-transistor EEPROM cell structure and a method for making the same so as that the effective channel length dimension is independent of the critical dimensions of the stacked gate structure. The cell structure includes an $n^-$ buried channel/junction region which is implanted before the formation of a tunnel oxide and a stacked gate structure. After the stacked gate formation, a p-type source region is implanted in the substrate with a large tilt angle. Thereafter, $n^+$ drain and $n^+$ source regions are implanted in the substrate which are self-aligned to the stacked gate structure.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A one-transistor memory cell structure comprising:

a substrate (112);

an $n^-$ buried channel/junction region (116) disposed in said substrate;

an $n^+$-type drain region (118) disposed in said substrate and on a first side of said $n^-$ buried channel/junction region defining a drain side;

a source structure (120) disposed in said substrate and on a second side of said $n^-$ buried channel/junction region defining a source side;

said source structure including a first p-type source region (122) and a second $n^+$-type source region (124) disposed in said first p-type source region;

said p-type source region (122) being formed by implanting on the source side with a large tilt angle;

a tunnel oxide (126) disposed on said substrate;

a stacked gate structure (134) disposed on said tunnel oxide and being formed over said $n^-$ buried channel/junction region (116)

said stacked gate structure (134) including a floating gate (128), an inter-gate dielectric (130) disposed on said floating gate, and a control gate (132) disposed on said inter-gate dielectric;

said tunnel oxide (126) overlying a portion (119) of said $n^+$-type drain region (118), said first p-type source region (122), and a portion (125) of said second $n^+$ source region (124); and said channel length of said memory cell being set by said p-type source region (122) on said source side, and is independent of critical dimensions of said stacked gate structure, thereby rendering scalability to small size and suitable for high density and low voltage power supply applications.

2. A one-transistor memory cell structure as claimed in claim 1, wherein said $n^-$ buried channel/junction region (116) has a thickness in the range of 1000 to 2000 Å.

3. A one-transistor memory cell structure as claimed in claim 2, wherein said $n^-$ buried channel/junction region (116) is formed by implanting phosphorous ions with a density in the range of $1 \times 10^{13}$ to $3 \times 10^{14}$ ions/cm$^2$.

4. A one-transistor memory cell structure as claimed in claim 1, wherein said p-type source region (122) is formed by implanting boron ions with a density of $5 \times 10^{13}$ to $8 \times 10^{14}$ ions/cm$^2$.

5. A one-transistor memory cell structure as claimed in claim 1, wherein said tunnel oxide (126) has a thickness of less than approximately 100 Å.

* * * * *